United States Patent
Forbes

(10) Patent No.: US 7,030,436 B2
(45) Date of Patent: Apr. 18, 2006

(54) EMBEDDED DRAM GAIN MEMORY CELL HAVING MOS TRANSISTOR BODY PROVIDED WITH A BI-POLAR TRANSISTOR CHARGE INJECTING MEANS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 10/309,873

(22) Filed: Dec. 4, 2002

(65) Prior Publication Data

US 2004/0108532 A1 Jun. 10, 2004

(51) Int. Cl.
*H01L 27/108* (2006.01)

(52) U.S. Cl. .................. 257/296; 257/322

(58) Field of Classification Search ......... 257/296–330, 257/213, 273
See application file for complete search history.

(56) References Cited

U.S. PATENT DOCUMENTS

| | | | |
|---|---|---|---|
| 4,130,892 A | 12/1978 | Gunckel et al. | |
| 4,826,780 A * | 5/1989 | Takemoto et al. | |
| 4,970,689 A | 11/1990 | Kenney | 365/189.01 |
| 4,999,811 A | 3/1991 | Banerjee | 365/149 |
| 5,006,909 A | 4/1991 | Kosa | |
| 5,042,011 A | 8/1991 | Casper et al. | 365/205 |
| 5,066,607 A | 11/1991 | Banerjee | 437/52 |
| 5,078,798 A | 1/1992 | Nicolson et al. | |
| 5,122,986 A | 6/1992 | Lim | 365/189.11 |
| 5,220,530 A | 6/1993 | Itoh | 365/189.01 |
| 5,280,205 A | 1/1994 | Green et al. | 307/530 |
| 5,291,438 A | 3/1994 | Witek et al. | |
| 5,308,783 A | 5/1994 | Krautschneider et al. | 437/52 |
| 5,329,481 A | 7/1994 | Seevinck et al. | |
| 5,448,513 A | 9/1995 | Hu et al. | 365/150 |
| 5,627,785 A | 5/1997 | Gilliam et al. | 365/189.01 |
| 5,732,014 A | 3/1998 | Forbes | 365/149 |
| 5,793,686 A | 8/1998 | Furutani et al. | |
| 5,815,432 A | 9/1998 | Naffziger et al. | |
| 5,897,351 A | 4/1999 | Forbes | 438/242 |
| 5,936,274 A | 8/1999 | Forbes et al. | 257/315 |
| 5,937,296 A | 8/1999 | Arnold | |
| 5,966,319 A | 10/1999 | Sato | |
| 5,973,356 A | 10/1999 | Noble et al. | 257/319 |
| 5,991,225 A | 11/1999 | Forbes et al. | 365/230.06 |
| 5,995,419 A | 11/1999 | Trimberger | |
| 5,999,442 A | 12/1999 | Van Der Sanden et al. | |
| 5,999,455 A * | 12/1999 | Lin et al. | 365/185.24 |
| 6,072,209 A | 6/2000 | Noble et al. | 257/296 |
| 6,077,745 A | 6/2000 | Burns, Jr. et al. | |
| 6,097,065 A | 8/2000 | Forbes et al. | 257/350 |
| 6,111,286 A | 8/2000 | Chi et al. | |

(Continued)

OTHER PUBLICATIONS

Adler, E., et al., "The Evolution of IBM CMOS DRAM Technology", *IBM Journal of Research & Development*, vol. 39, (1995), 167–188.

(Continued)

*Primary Examiner*—Fetsum Abraham
(74) *Attorney, Agent, or Firm*—Schwegman, Lundberg, Woessner & Kluth, P.A.

(57) ABSTRACT

A high density horizontal merged MOS-bipolar gain memory cell is realized for DRAM operation. The gain cell includes a horizontal MOS transistor having a source region, a drain region, and a floating body region therebetween. The gain cell includes a horizontal bi-polar transistor having an emitter region, a base region and a collector region. The collector region for the horizontal bi-polar transistor serves as the floating body region for the horizontal MOS transistor. A gate opposes the floating body region and is separated therefrom by a gate oxide. The emitter region for the horizontal bi-polar transistor is coupled to a write data line.

50 Claims, 8 Drawing Sheets

U.S. PATENT DOCUMENTS

| | | | |
|---|---|---|---|
| 6,124,729 A | 9/2000 | Noble et al. | 326/41 |
| 6,143,636 A | 11/2000 | Forbes et al. | 438/587 |
| 6,150,687 A | 11/2000 | Noble et al. | 257/302 |
| 6,153,468 A | 11/2000 | Forbes et al. | 438/257 |
| 6,172,390 B1 | 1/2001 | Rupp et al. | |
| 6,172,901 B1 | 1/2001 | Portacci | |
| 6,204,115 B1 | 3/2001 | Cho | |
| 6,238,976 B1 | 5/2001 | Noble et al. | 438/259 |
| 6,246,083 B1 | 6/2001 | Noble | 257/296 |
| 6,282,115 B1 | 8/2001 | Furukawa et al. | |
| 6,316,309 B1 | 11/2001 | Holmes et al. | |
| 6,440,801 B1 | 8/2002 | Furukawa et al. | |
| 6,549,453 B1 | 4/2003 | Wong | |
| 6,556,471 B1 | 4/2003 | Chappell et al. | |
| 6,560,139 B1 | 5/2003 | Ma et al. | |
| 6,566,682 B1 | 5/2003 | Forbes | |
| 6,611,451 B1 | 8/2003 | Houston | |
| 6,624,033 B1 | 9/2003 | Noble | |
| 6,680,864 B1 | 1/2004 | Noble | 365/177 |
| 6,710,465 B1 | 3/2004 | Song et al. | |
| 6,727,141 B1 | 4/2004 | Bronner et al. | |
| 6,838,723 B1 | 1/2005 | Forbes | |
| 2001/0028078 A1 | 10/2001 | Noble | 257/303 |
| 2001/0030338 A1 | 10/2001 | Noble | 257/303 |
| 2004/0041236 A1 | 3/2004 | Forbes | |
| 2005/0012130 A1 | 1/2005 | Forbes | |
| 2005/0024936 A1 | 2/2005 | Forbes | |
| 2005/0032313 A1 | 2/2005 | Forbes | |
| 2005/0041457 A1 | 2/2005 | Forbes | |
| 2005/0068828 A1 | 3/2005 | Forbes | |
| 2005/0094453 A1 | 5/2005 | Forbes | |

OTHER PUBLICATIONS

Blalock, T. N., et al., "An Experimental 2T Cell RAM with 7 NS Access Time at Low Temperature", *IEEE*, 1990 Symposium on VLSi Circuits, Alabama Microelectronics Science and Technology Center, Electrical Engineering Department,(1990),pp. 13–14.

Kim, Wonchan , et al., "A low–voltage multi–bit DRAM cell with a built–in gain stage", *Esscirc 93, Nineteenth European Solid–State Circuits Conference*, (1995), 1 page.

Kim, W. , "An Experimental High–Density DRAM Cell with a Build–in Gain Stage", *IEEE Journal of Solid–State Circuits*, vol. 29, no. 8, (1994), 978–981.

Krautschneider, W.H. , et al., "Fully scalable gain memory cell for future DRAMs", *Microelectron Eng. (Netherlands).*, Microlelctronic Engineering, vol. 15, No. 1-4,(1991), 1 page.

Krautschneider, F. , "Planar Gain Cell for Low Voltage Operation and Gigabit Memories", *Symposium on VLSI Technology Digest of Technical Papers*, (1995), 139–140.

Mukai, M , et al., "Proposal of a Logic Compatible Merged–Typed Gain Cell for High Density Embedded . . . ", *IEEE Trans. on Electron Devices*, (1999),2 pages.

Ohsawa, T , "Memory design using one–transistor gain cell on SOI", *IEEE International Solid–State Circuits Conference. Digest of Technical Papers*, vol. 1, (2002), 152–455.

Okhonin, S , "A SOI capacitor–less 1T–DRAM concept", *2001 IEEE International SOI Conference. Proceedings, IEEE. 2001*, (2000), 153–4.

Rabaey, Jan M., "Digital Integrated circuits : a design perspective", Book, Published Upper Saddle River, N.J. : Prentice Hall, c1996,(1996),585–590.

Shukuri, S , "A complementary gain cell technology for sub–1 V supply DRAMs", *Electron Devices Meeting 1992. Technical Digest*, (1992), 1006–1009.

Shukuri, S. , "A Semi–Static Complementary Gain Cell Technology for Sub–1 V Supply DRAMs", *IEEE Transactions on Electron Devices*, vol. 41, no. 6, (Jun. 1994), 926–931.

Shukuri, S. , "Super–Low Voltage Operation of a Semi–Static Complementary Gain DRAM Memory Cell", *Symposium on VLSI Technology. Digest of Technical Papers*, (1993),23–24.

Sunouchi, K , et al., "A self–amplifying (SEA) cell for future high density DRAMs", *International Electron Devices Meeting 1991. Technical Digest*, (1991),465–8.

Takato, H. , et al., "Process Integration Trends for Embedded DRAM", *Proceedings of UISI Process Integration, Electrochemical Society Proceedings*, 99–18,(1999),2 pages.

Terauchi, M. , "A Surrounding Gate Transistor (SGT) Gain Cell for Ultra High Density DRAMs", *1993 Symposium on VLSI Technology, Digest of Technical Papers*, Kyoto, Japan, (1993),21–22.

Wann, H. , et al., "A Capacitorless DRAM Cell on SOI Substrate", *International Electron Devices Meeting 1993. Technical Digest*, (1993),635–638.

Adler, E., et al., "The Evolution of IBM CMOS DRAM Technology", *IBM Journal of Research & Development*, 39(1–2), (Jan.–Mar. 1995), 167–188.

Blalock, T. N., et al., "An Experimental 2T Cell RAM with 7 NS Access Time at Low Temperature", *1990 Symposium on VLSI Circuits. Digest of Technical Papers,*(1990),13–14.

Kim, Wonchan, "A low–voltage multi–bit DRAM cell with a built–in gain stage", *ESSCIRC 93. Nineteenth European Solid–State Circuits Conference. Proceedings,*(1993), 37–40.

Kim, W., "An Experimental High–Density DRAM Cell with a Built–in Gain Stage", *IEEE Journal of Solid–State Circuits,*29(8), (Aug. 1994),978–981.

Krautschneider, W H., et al., "Fully scalable gain memory cell for future DRAMs", *Microelectronic Engineering*, 15(1–4), (Oct. 1991),367–70.

Krautschneider, F., "Planar Gain Cell for Low Voltage Operation and Gigabit Memories", *Symposium on VLSI Technology Digest of Technical Papers,*(1995),139–140.

Mukai, M., et al., "Novel merged gain cell for logic compatible high density DRAMs", *1997 Symposium on VLSI Technology. Digest of Technical Papers,*(Jun. 10–12, 1997), 155–156.

Mukai, M, et al., "Proposal of a logic Compatible Merged–Type Gain Cell for High Density Embedded. . . ", *IEEE Transactions on Electron Devices,*(Jun. 1999),1201–1206.

Ohsawa, T, "Memory design using one–transistor gain cell on SOI", *IEEE International Solid–State Circuits Conference. Digest of Technical Papers, vol. 1,*(2002),152–455.

Okhonin, S, "A SOI capacitor–less 1T–DRAM concept", *2001 IEEE International SOI Conference. Proceedings, IEEE. 2001,*(2000),153–4.

Rabaey, Jan M., "Digital Integrated circuits: a design perspective", *Upper Saddle River, N.J.: Prentice Hall,*(1996), 585–590.

Shukuri, S, "A complementary gain cell technology for sub–1 V supply DRAMs", *Electron Devices Meeting 1992. Technical Digest,*(1992),1006–1009.

Shukuri, S., "A Semi–Static Complementary Gain Cell Technology for Sub–1 V Supply DRAMs", *IEEE Transactions on Electron Devices, 41(6),*(Jun. 1994),926–931.

Shukuri, S., "Super–Low Voltage Operation of a Semi–Static Complementary Gain DRAM Memory Cell", *Symposium on VLSI Technology. Digest of Technical Papers,* (1993),23–24.

Sunouchi, K, et al., "A Self–amplifying (SEA) cell for future high density DRAMs", *International Electron Devices Meeting 1991. Technical Digest,*(1991), 465–8.

Takato, H., et al., "Process Integration Trends for Embedded DRAM", *ULSI Process Integration. Proceedings of the First International Symposium (Electrochemical Society Proceedings vol. 99–18,*(1999),107–19.

Terauchi, M., "A Surrounding Gate Transistor (SGT) Gain Cell for Ultra High Density DRAMs", *1993 Symposium on VLSI Technology, Digest of Technical Papers,*Kyoto, Japan, (1993),21–22.

Wann, Hsing–Jen, "A Capacitorless DRAM Cell on SOI Substrate", *International Electron Devices Meeting 1993. Technical Digest,*(Dec. 5–8, 1993),635–638.

\* cited by examiner

EMBEDDED DRAM GAIN MEMORY CELL HAVING MOS TRANSISTOR BODY PROVIDED WITH A BI-POLAR TRANSISTOR CHARGE INJECTING MEANS

CROSS REFERENCE TO RELATED APPLICATIONS

This application is related to the following commonly assigned U.S. patent applications: "Single Transistor Vertical Memory Gain Cell," Ser. No. 10/231,397, filed Aug. 29, 2002, "Merged MOS-Bipolar Capacitor Memory Cell," Ser. No. 10/230,929, filed Aug. 29, 2002, each of which disclosure is herein incorporated by reference.

FIELD OF THE INVENTION

The present invention relates generally to integrated circuits, and in particular to an embedded DRAM gain memory cell.

BACKGROUND OF THE INVENTION

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 100. Each cell 100 contains a storage capacitor 140 and an access field effect transistor or transfer device 120. For each cell, one side of the storage capacitor 140 is connected to a reference voltage (illustrated as a ground potential for convenience purposes). The other side of the storage capacitor 140 is connected to the drain of the transfer device 120. The gate of the transfer device 120 is connected to a signal known in the art as a word line 180. The source of the transfer device 120 is connected to a signal known in the art as a bit line 160 (also known in the art as a digit line). With the memory cell 100 components connected in this manner, it is apparent that the word line 180 controls access to the storage capacitor 140 by allowing or preventing the signal (representing a logic "0" or a logic "1") carried on the bit line 160 to be written to or read from the storage capacitor 140. Thus, each cell 100 contains one bit of data (i.e., a logic "0" or logic "1").

In FIG. 2 a DRAM circuit 240 is illustrated. The DRAM 240 contains a memory array 242, row and column decoders 244, 248 and a sense amplifier circuit 246. The memory array 242 consists of a plurality of memory cells 200 (constructed as illustrated in FIG. 1) whose word lines 280 and bit lines 260 are commonly arranged into rows and columns, respectively. The bit lines 260 of the memory array 242 are connected to the sense amplifier circuit 246, while its word lines 280 are connected to the row decoder 244. Address and control signals are input on address/control lines 261 into the DRAM 240 and connected to the column decoder 248, sense amplifier circuit 246 and row decoder 244 and are used to gain read and write access, among other things, to the memory array 242.

The column decoder 248 is connected to the sense amplifier circuit 246 via control and column select signals on column select lines 262. The sense amplifier circuit 246 receives input data destined for the memory array 242 and outputs data read from the memory array 242 over input/output (I/O) data lines 263. Data is read from the cells of the memory array 242 by activating a word line 280 (via the row decoder 244), which couples all of the memory cells corresponding to that word line to respective bit lines 260, which define the columns of the array. One or more bit lines 260 are also activated. When a particular word line 280 and bit lines 260 are activated, the sense amplifier circuit 246 connected to a bit line column detects and amplifies the data bit transferred from the storage capacitor of the memory cell to its bit line 260 by measuring the potential difference between the activated bit line 260 and a reference line which may be an inactive bit line. The operation of DRAM sense amplifiers is described, for example, in U.S. Pat. Nos. 5,627,785; 5,280,205; and 5,042,011, all assigned to Micron Technology Inc., and incorporated by reference herein.

The memory cells of dynamic random access memories (DRAMs) are comprised of two main components, a field-effect transistor (FET) and a capacitor which functions as a storage element. The need to increase the storage capability of semiconductor memory devices has led to the development of very large scale integrated (VLSI) cells which provides a substantial increase in component density. As component density has increased, cell capacitance has had to be decreased because of the need to maintain isolation between adjacent devices in the memory array. However, reduction in memory cell capacitance reduces the electrical signal output from the memory cells, making detection of the memory cell output signal more difficult. Thus, as the density of DRAM devices increases, it becomes more and more difficult to obtain reasonable storage capacity.

As DRAM devices are projected as operating in the gigabit range, the ability to form such a large number of storage capacitors requires smaller areas. However, this conflicts with the requirement for larger capacitance because capacitance is proportional to area. Moreover, the trend for reduction in power supply voltages results in stored charge reduction and leads to degradation of immunity to alpha particle induced soft errors, both of which require that the storage capacitance be even larger.

By using embedded memory rather than external memory, designers can maximize memory throughput to achieve higher system performance, introduce innovative architectures with customized memory sizes, and reduce power consumption in their systems. (See generallly, H. Takato et al., "Process Integration Trends for Embedded DRAM," *Proceedings of UlSI Process Integration, Electrochemical Society Proceedings*, 99–18, 107–19 (1999); M. Mukai et al., "Proposal of a Logic Compatible Merged-Type Gain Cell for High Density Embedded.," *IEEE Trans. on Electron Devices*, 46–6, 1201–1206 (1999)). Designers will also benefit from less expensive packaging, by removing the extra pins that drive external memory and by eliminating board space otherwise required by external memory chips. Both of these benefits can lower production costs. In addition, using embedded memory ensures users of a guaranteed supply of this type of memory, without the volatility of the external memory market.

One approach to embedded memory technology is based on the one transistor DRAM cell structure that utilizes the trench process employed in IBM's and Toshiba's DRAMs. (See generally, W. P. Noble et al., "The evolution of IBM CMOS DRAM Technology," *IBM J. Research and Development*, 39-1/2, 167–188 (1995)). With trench technology, logic performance is not compromised. Trench technology provides a planar surface topology that enhances interconnect reliability while providing a DRAM storage capacitor with a large and conventional storage capacitance. However, additional masking levels are required in the logic technology to fabricate the trench capacitors.

Another approach to embedded memory is based on a three transistor DRAM cell structure, shown in FIG. 3. The three transistor DRAM cell structure was developed prior to the use of the trench capacitors or stacked capacitors now used in DRAMs. (See generally, J. Rabaey, Digital Integrated Circuits, Prentice Hall, 585–587 (1996)). A much smaller storage capacitor was utilized and compensated for by the gain of one of the transistors, in other words the first DRAMs developed used gain cells. These type of DRAM cells require only a minor modification of the conventional logic technology processes but occupy a large area due to the use of three transistors.

The inventors have previously disclosed a DRAM gain cell using two transistors. (See generally, L. Forbes, "Merged Transistor Structure for Gain Memory Cell," U.S. Pat. No. 5,732,014, issued 24 Mar. 1998, continuation granted as U.S. Pat. No. 5,897,351, issued 27 Apr. 1999). A number of other gain cells have also been disclosed. (See generally, Sunouchi et al., "A self-Amplifying (SEA) Cell for Future High Density DRAMs," Ext. Abstracts of IEEE Int. Electron Device Meeting, pp. 465–468 (1991); M. Terauchi et al., "A Surrounding Gate Transistor (SGT) Gain Cell for Ultra High Density DRAMS," VLSI Tech. Symposium, pp. 21–22 (1993); S. Shukuri et al., "Super-Low-Voltage Operation of a Semi-Static Complementary Gain RAM Memory Cell," VLSI Tech. Symposium pp. 23–24 (1993); S. Shukuri et al., "Super-low-voltage operation of a semi-static complementary gain DRAM memory cell," Ext. Abs. of IEEE Int. Electron Device Meeting, pp. 1006–1009 (1992); S. Shukuri et al., "A Semi-Static Complementary Gain Cell Technology for Sub-1 V Supply DRAM's," IEEE Trans. on Electron Devices, Vol. 41, pp. 926–931 (1994); H. Wann and C. Hu, "A Capacitorless DRAM Cell on SOI Substrate," Ext. Abs. IEEE Int. Electron Devices Meeting, pp. 635–638; W. Kim et al., "An Experimental High-Density DRAM Cell with a Built-in Gain Stage," IEEE J. of Solid-State Circuits, Vol. 29, pp. 978–981 (1994); W. H. Krautschneider et al., "Planar Gain Cell for Low Voltage Operation and Gigabit Memories," Proc. VLSI Technology Symposium, pp. 139–140 (1995); D. M. Kenney, "Charge Amplifying trench Memory Cell," U.S. Pat. No. 4,970,689, 13 Nov. 1990; M. Itoh, "Semiconductor memory element and method of fabricating the same," U.S. Pat. No. 5,220,530, 15 Jun. 1993; W. H. Krautschneider et al., "Process for the Manufacture of a high density Cell Array of Gain Memory Cells," U.S. Pat. No. 5,308,783, 3 May 1994; C. Hu et al., "Capacitorless DRAM device on Silicon on Insulator Substrate," U.S. Pat. No. 5,448,513, 5 Sept. 1995; S. K. Banerjee, "Method of making a Trench DRAM cell with Dynamic Gain," U.S. Pat. No. 5,066,607, 19 Nov. 1991; S. K. Banerjee, "Trench DRAM cell with Dynamic Gain," U.S. Pat. No. 4,999,811, 12 Mar. 1991; Lim et al., "Two transistor DRAM cell," U.S. Pat. No. 5,122,986, 16 Jun. 1992).

Recently a one transistor gain cell has been reported as shown in FIG. 4. (See generally, T. Ohsawa et al., "Memory design using one transistor gain cell on SOI," IEEE Int. Solid State Circuits Conference, San Francisco, 2002, pp. 152–153). FIG. 4 illustrates a portion of a DRAM memory circuit containing two neighboring gain cells, 401 and 403. Each gain cell, 401 and 403, is separated from a substrate 405 by a buried oxide layer 407. The gain cells, 401 and 403, are formed on the buried oxide 407 and thus have a floating body, 409-1 and 409-2 respectively, separating a source region 411 (shared for the two cells) and a drain region 413-1 and 413-2. A bit/data line 415 is coupled to the drain regions 413-1 and 413-2 via bit contacts, 417-1 and 417-2. A ground source 419 is coupled to the source region 411. Wordlines or gates, 421-1 and 421-2, oppose the floating body regions 409-1 and 409-2 and are separated therefrom by a gate oxide, 423-1 and 423-2.

In the gain cell shown in FIG. 4 a floating body, 409-1 and 409-2, back gate bias is used to modulate the threshold voltage and consequently the conductivity of the NMOS transistor in each gain cell. The potential of the back gate body, 409-1 and 409-2, is made more positive by avalanche breakdown in the drain regions, 413-1 and 413-2, and collection of the holes generated by the body, 409-1 and 409-2. A more positive potential or forward bias applied to the body, 409-1 and 409-2, decreases the threshold voltage and makes the transistor more conductive when addressed. Charge storage is accomplished by this additional charge stored on the floating body, 409-1 and 409-2. Reset is accomplished by forward biasing the drain-body n-p junction diode to remove charge from the body.

Still, there is a need in the art for improved DRAM cell structures which can be based entirely on conventional CMOS logic technology, without additional masking and process steps, and which have a minimal cell area.

SUMMARY OF THE INVENTION

The above mentioned problems with conventional memories and other problems are addressed by the present invention and will be understood by reading and studying the following specification. An embedded, high density horizontally merged MOS-bipolar gain memory cell is realized for DRAM operation.

In one embodiment of the present invention, a high density horizontally merged MOS-bipolar gain memory cell is realized for DRAM operation. The gain cell includes a horizontal MOS transistor having a source region, a drain region, and a floating body region therebetween. The gain cell includes a horizontal bi-polar transistor having an emitter region, a base region and a collector region. The collector region for the horizontal bi-polar transistor serves as the floating body region for the horizontal MOS transistor. A gate opposes the floating body region and is separated therefrom by a gate dielectric. The emitter region for the horizontal bi-polar transistor is coupled to a write data line. The gate is coupled to a read data word line. The source region is coupled to a read data bit line.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
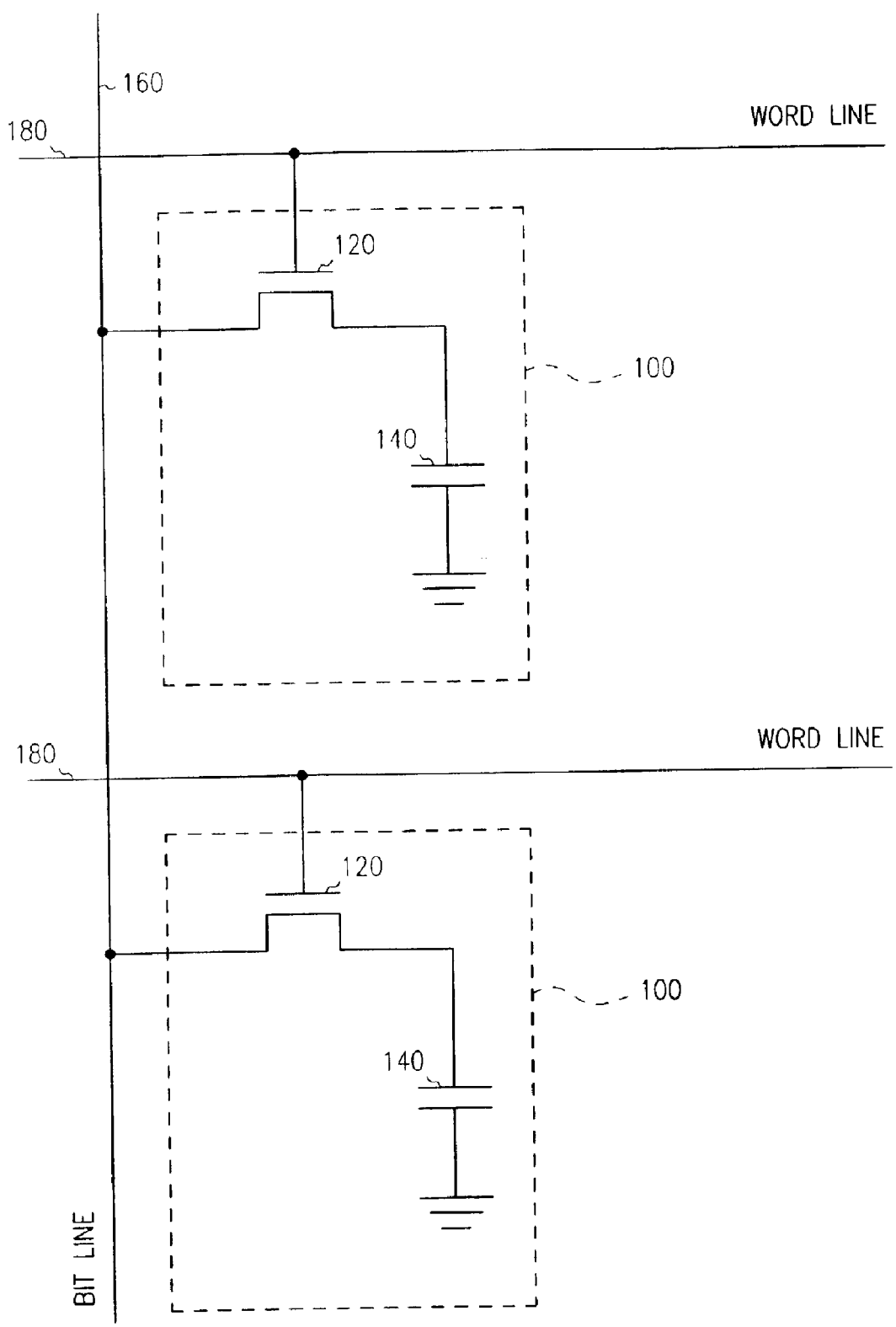
FIG. 1 is a circuit diagram illustrating conventional dynamic random access memory (DRAM) cells.
Figure 2:
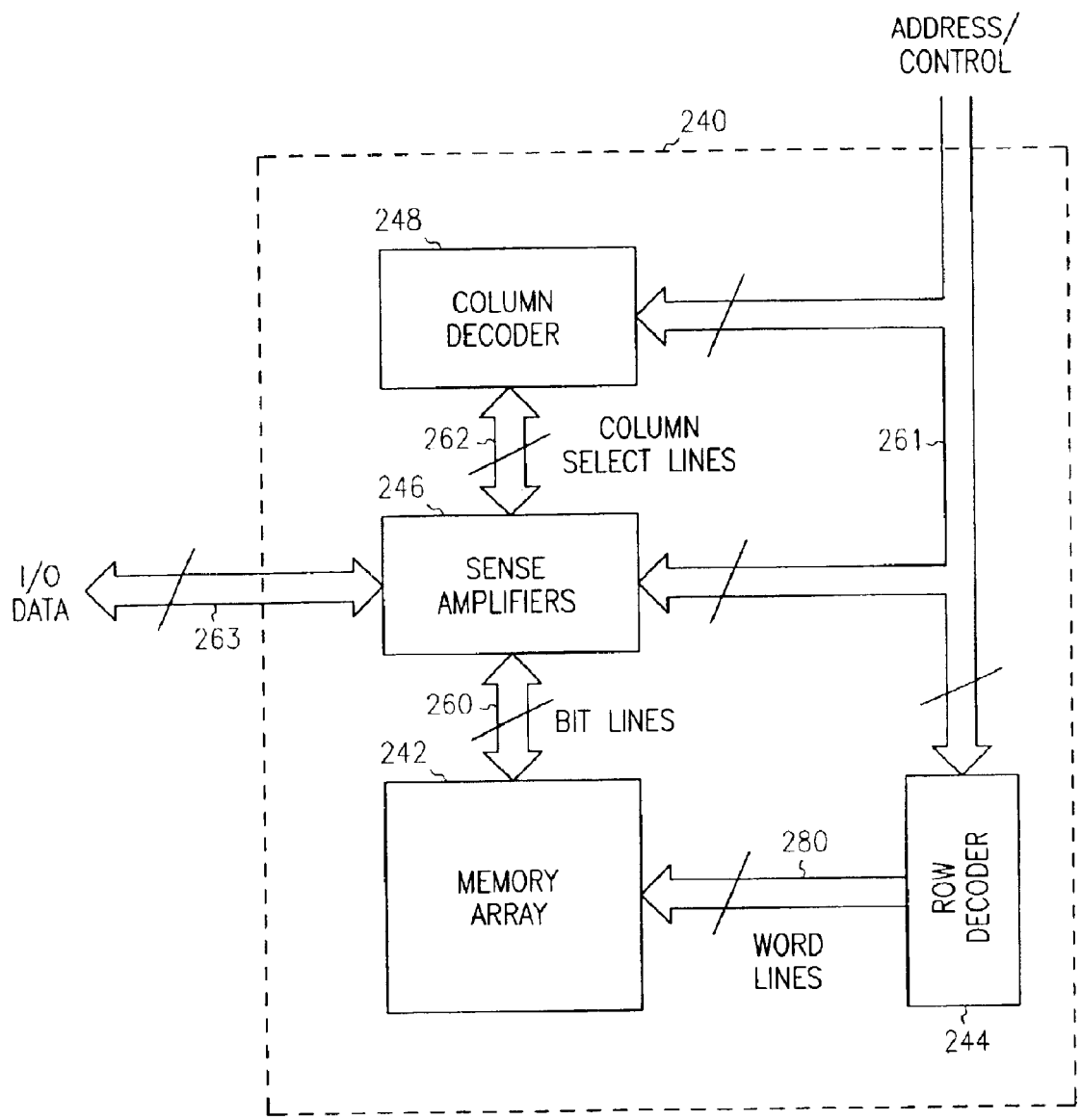
FIG. 2 is a block diagram illustrating a DRAM device.
Figure 3:
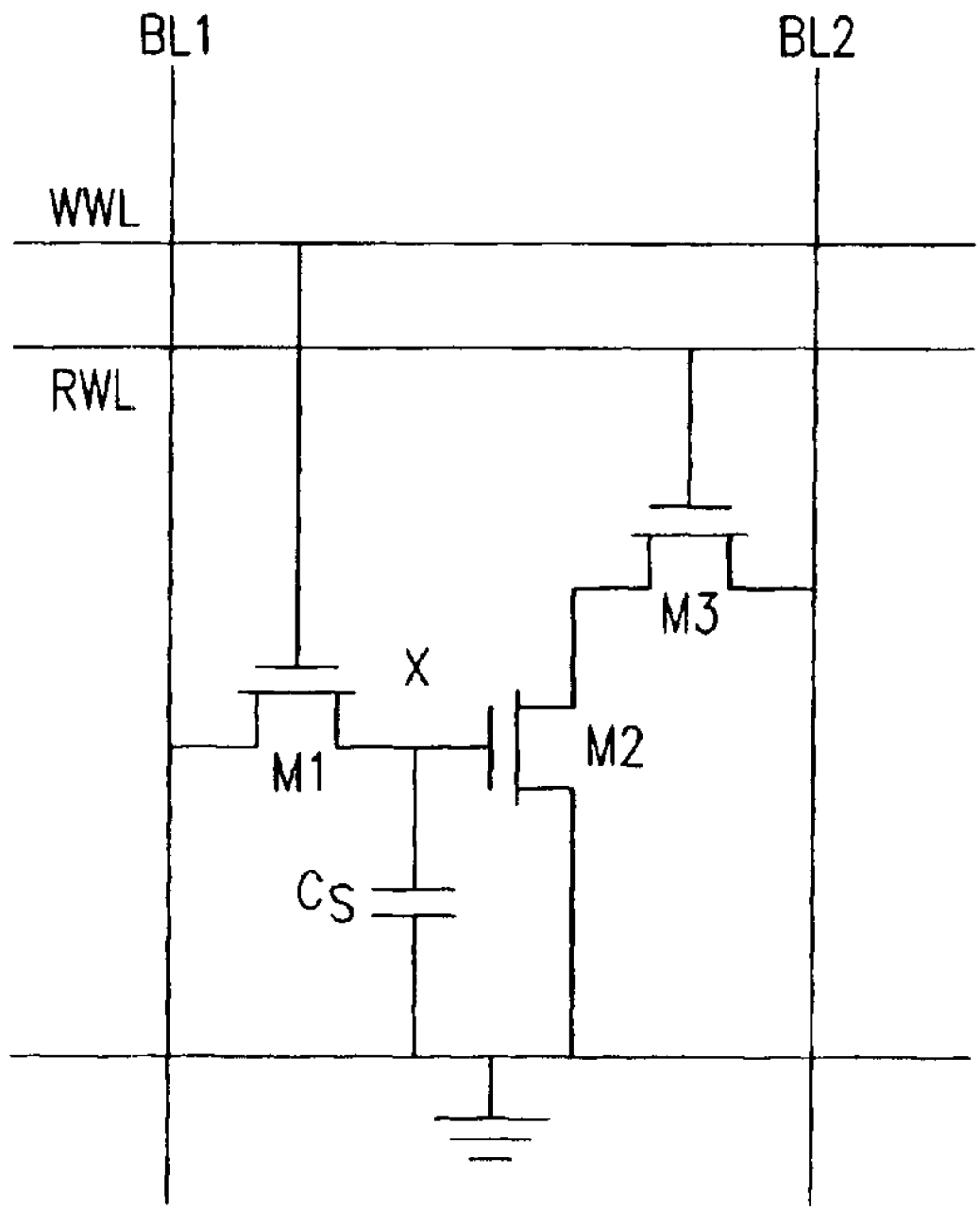
FIG. 3 is a schematic for an embedded memory based on a three transistor DRAM cell structure.
Figure 4:
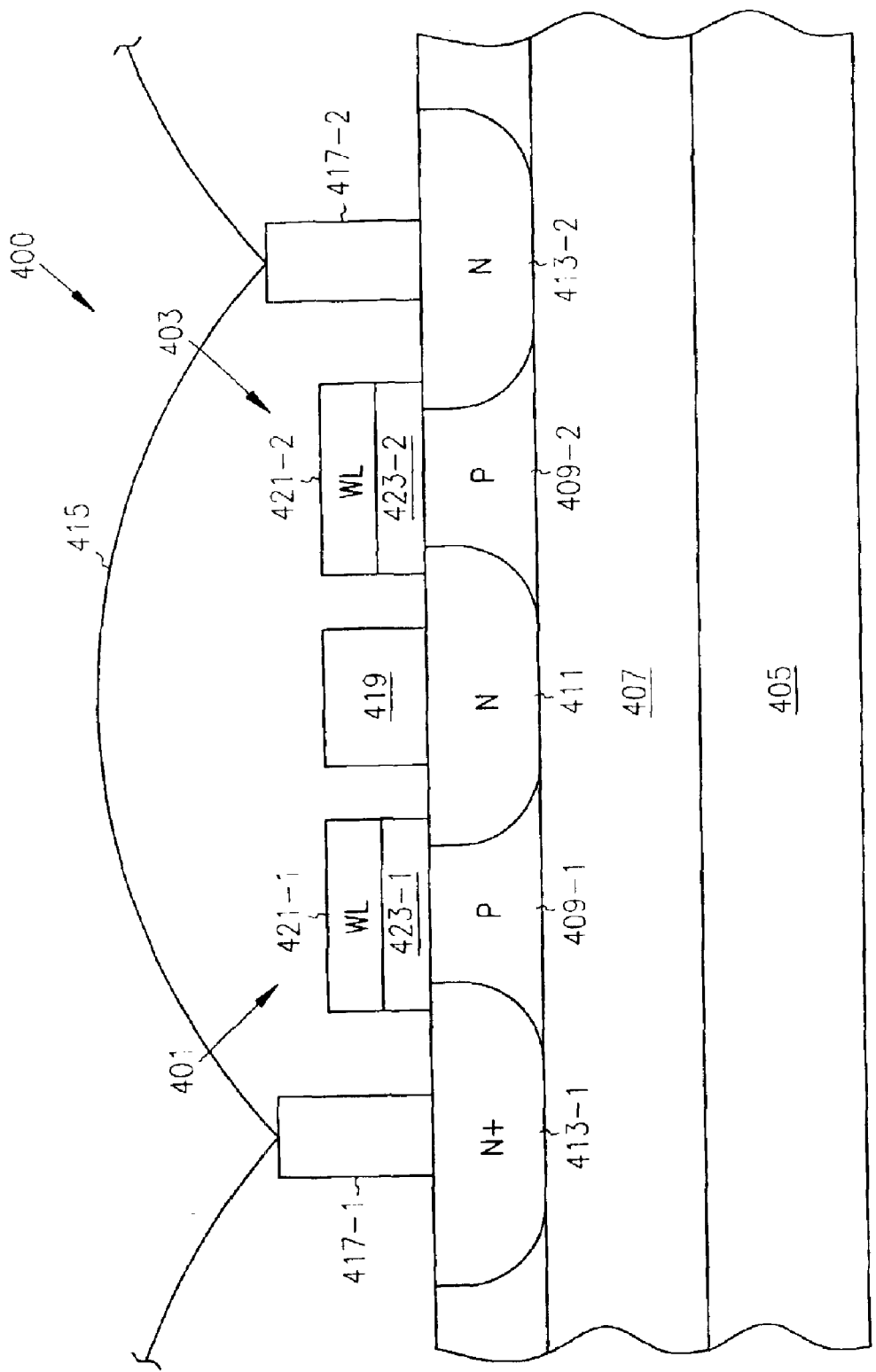
FIG. 4 illustrates two neighboring one transistor gain cells as a portion of a memory array.
Figure 5A:
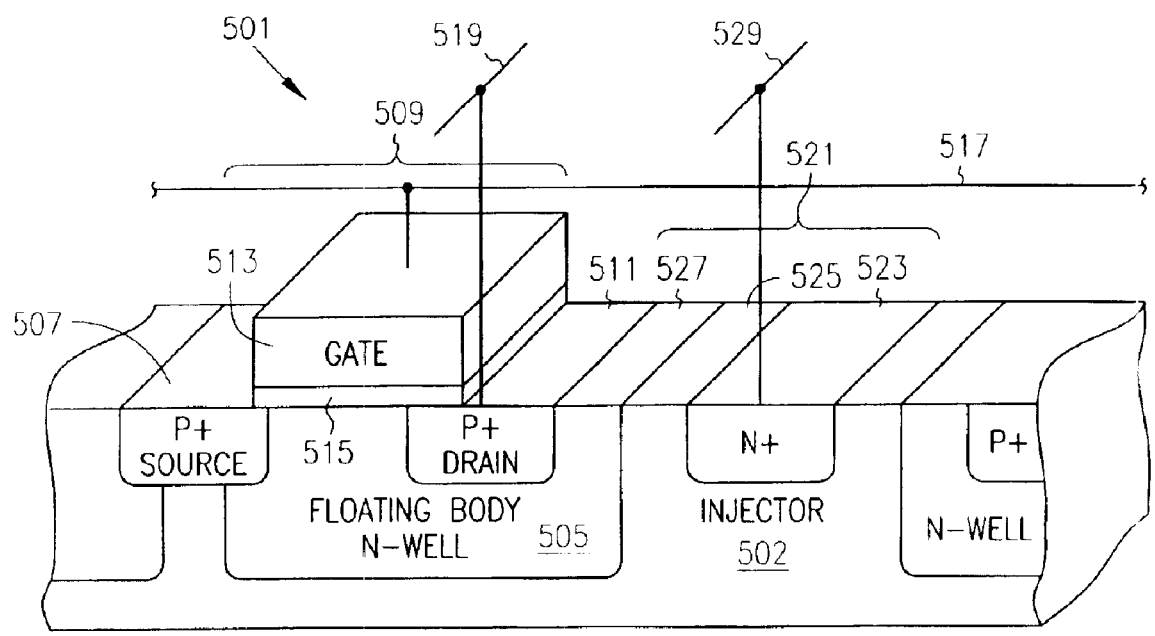
FIG. 5A is a cross-sectional, perspective view illustrating an embodiment of a horizontally merged MOS-bipolar transistor gain memory cell according to the teachings of the present invention.

FIG. 5A is a cross-sectional, perspective view illustrating an embodiment of an embedded, horizontally merged MOS-bipolar transistor gain memory cell 501 according to the teachings of the present invention. In the embodiment of FIG. 5A, the embedded, horizontally merged MOS-bipolar transistor gain memory cell 501 is formed in a p-type conductivity substrate 502. An n-type conductivity well 505 is formed in the p-type conductivity substrate 502. A more heavily doped p-type conductivity region (p+) 507 is formed in a portion of the p-type conductivity substrate 502 and in a portion of the n-type conductivity well 505. The more heavily doped p-type conductivity region (p+) 507 serves as a source region 507 for a horizontal MOS transistor 509 portion of the horizontally merged MOS-bipolar transistor gain memory cell 501.

Another more heavily doped p-type conductivity region (p+) 511 is formed in another portion of the n-type conductivity well 505. This more heavily doped p-type conductivity region (p+) 511 serves as the drain region 511 for the horizontal MOS transistor 509 portion of the horizontally merged MOS-bipolar transistor gain memory cell 501. A gate 513 opposes the n-type conductivity well 505 between the source and the drain regions, 507 and 511 respectively. As one of ordinary skill in the art will understand upon reading this disclosure, the n-type conductivity well 505 serves as a body region 505 and, more particularly, as a floating body region 505 for the horizontal MOS transistor 509 portion of the horizontally merged MOS-bipolar transistor gain memory cell 501. The n-type conductivity well 505 can also be referred to as a floating body n-well 505.

The gate 513 is separated from the floating body region 505 by a gate dielectric 515. As shown in the embodiment of FIG. 5A, a read data word line 517 is coupled to the gate 513 along rows of an array. As one of ordinary skill in the art will appreciate upon reading this disclosure, any number of the horizontally merged MOS-bipolar transistor gain memory cell 501 shown in FIG. 5A can be arranged in an array on a semiconductor wafer. A read data bit line 519 is coupled to the drain region 511 along columns of such an array.

As shown in FIG. 5A, a horizontal bi-polar transistor 521 completes the horizontally merged MOS-bipolar transistor gain memory cell 501. The horizontal bi-polar transistor 521 includes an emitter region 523, a base region 525, and a collector region 527. As shown in the embodiment of FIG. 5A, the emitter region 523 includes a heavily doped n-type conductivity region 523 (n+) formed in the p-type conductivity substrate 502. The emitter region can also be referred to as an injector 523. In FIG. 5A, the base region 525 for the horizontal bi-polar transistor 521 portion of the is formed by the p-type conductivity substrate material. In some embodiments, the base region 525 and the p-type conductivity substrate 502 are coupled to a ground potential.

According to the teachings of the present invention, the collector region 527 for the horizontal bi-polar transistor 521 is formed from a portion of the floating body n-well 505. In the embodiment shown in FIG. 5A, the p+ drain region 511 is formed in the floating body n-well 505 and a portion of the floating body n-well 505 extends and/or wraps around the p+ drain region 511 to a side of the drain region 511 horizontally opposite from the side of the drain region 511 where the gate 513 is located. In this manner, the floating body n-well 505 serves both as a floating body region 505 for the horizontal MOS transistor 509 and a portion of the floating body n-well also serves as the collector region 527 of the horizontal bi-polar transistor 521.

As shown in the embodiment of FIG. 5A, a write data bit line 529 is coupled to the emitter region 523 for the horizontal bi-polar transistor 521 portion of the horizontally merged MOS-bipolar transistor gain memory cell 501. The write data bit line 529 can also be referred to as an emitter line 529 and/or an injector line 529. According to the teachings of the present invention, the horizontal bi-polar transistor 521 is operable to inject a charge on to the floating body 505 of the horizontal MOS transistor 509. The floating body 505 is operable to store charge by capacitive coupling to the gate 513 and a small stored charge from the same produces a change in the threshold voltage of the horizontal MOS transistor 509. As one of ordinary skill in the art will appreciate upon reading this disclosure, the horizontally merged MOS-bipolar transistor gain memory cell 501 can be formed or fabricated using planar CMOS processing techniques. As such, the present invention yields a horizontally merged MOS-bipolar transistor gain memory cell 501 which has an area equal to or less than 10 square photolithographic features (10F$^2$).

Figure 5B:
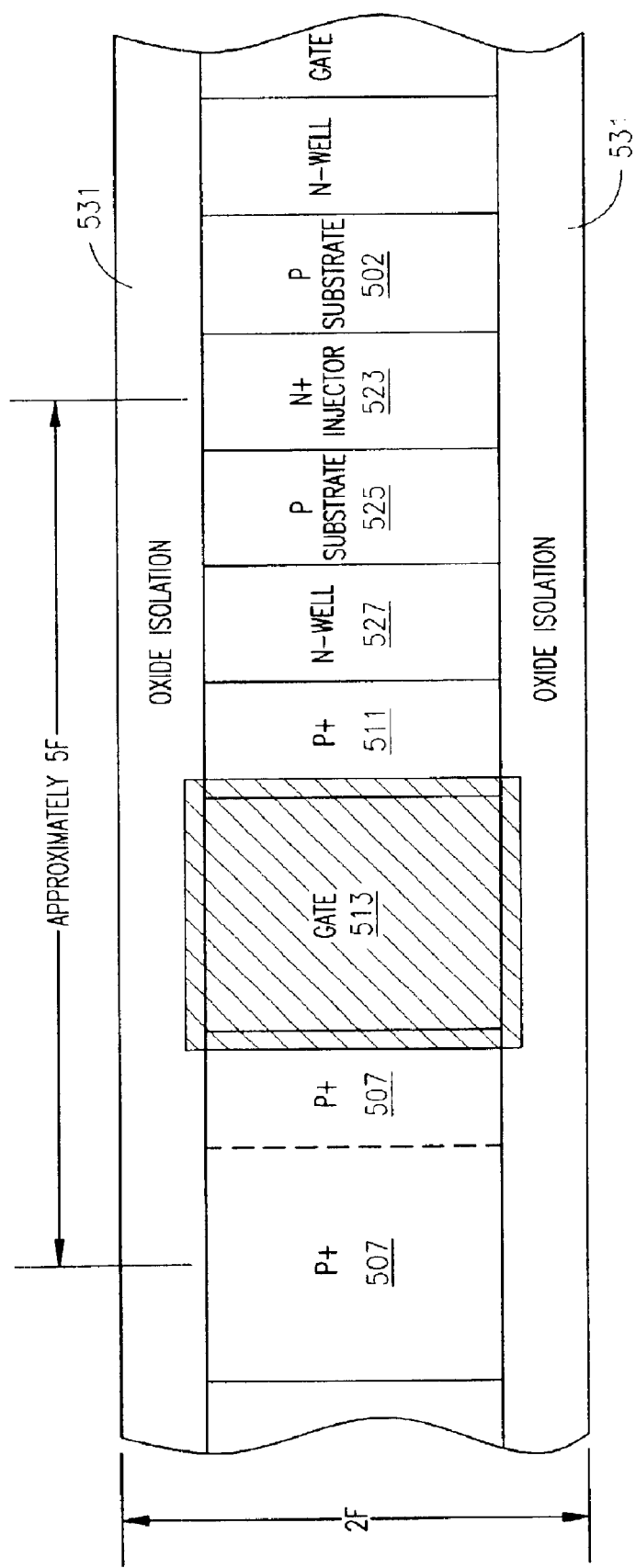
FIG. 5B illustrates a top view of FIG. 5A in planar, CMOS technology with shallow trench oxide isolation.

FIG. 5B illustrates a top view of FIG. 5A in planar, CMOS technology with shallow trench oxide isolation 531 illustrated alongside the horizontally merged MOS-bipolar transistor gain memory cell 501. The top view of FIG. 5A illustrates the heavily doped p-type conductivity source region 507 (p+). The gate 513 is shown above the floating body region 505 of the horizontal MOS transistor 509 portion of the horizontally merged MOS-bipolar transistor gain memory cell 501. On the other side of the gate 513 is shown the heavily doped p-type conductivity drain region 511 (p+). The portion of the floating body n-well 505 which serves as the collector region 527 for the horizontal bi-polar transistor 521 is seen from the top view on the opposite side of the drain region 511 from the gate's 513 location. From the top view embodiment of FIG. 5A, the p-type conductivity portion of the substrate which serves as the base region 525 for the horizontal bi-polar transistor 521 is viewable adjacent to the collector region 527. The heavily doped n-type conductivity emitter region, or injector, 523 (n+) is viewable adjacent to the base region 525. On the other side of the emitter region 523, another portion of the substrate 502 which serves as the base region 525 for an adjacent horizontal bi-polar transistor 521 portion of a row adjacent horizontally merged MOS-bipolar transistor gain memory cell is viewable as well as another portion of a neighboring floating body n-well.

Figure 5C:
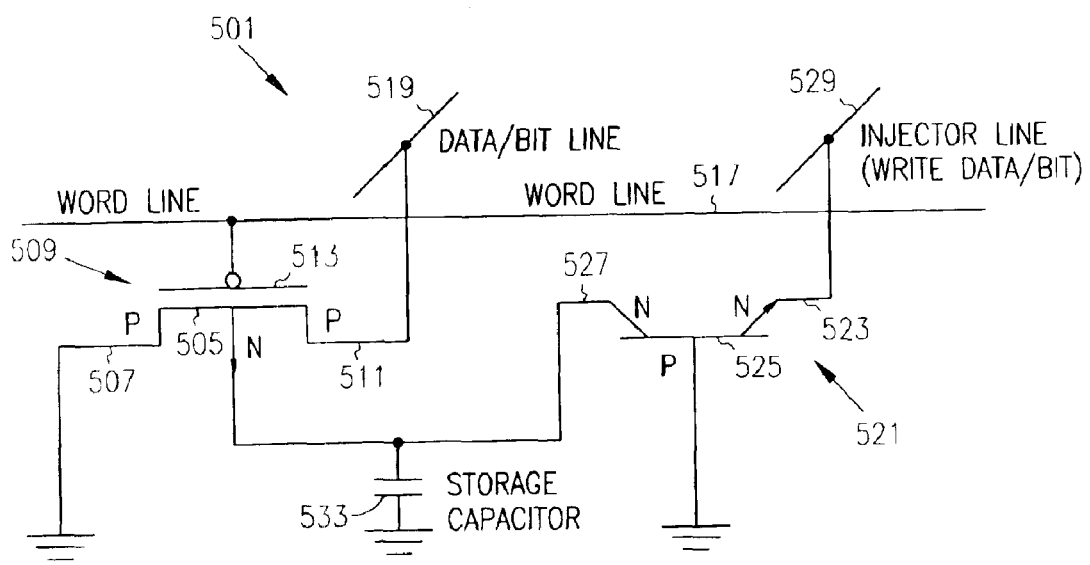
FIG. 5C illustrates an electrical equivalent circuit embodiment of the horizontally merged MOS-bipolar transistor gain memory cell indicating that the floating body well of the horizontal MOS transistor and the well to substrate capacitance acts as a storage capacitor.

FIG. 5C illustrates an electrical equivalent circuit embodiment of the horizontally merged MOS-bipolar transistor gain memory cell 501 indicating that the floating body well 505 of the horizontal MOS transistor 509 and the floating body well 505 to substrate 502 capacitance acts as a storage capacitor 533. The embodiment of FIG. 5C illustrates the horizontal MOS transistor 509 including the source region 507, the gate 513 opposing the floating body region 505, and the drain region 511. A read data word line 517 is shown coupled to the gate 513 and a read data bit line 519 is coupled to the drain region 511.

The embodiment of FIG. 5C further illustrates the bi-polar transistor 521 including the collector region 527, which is integrally formed with the floating body region 505, the base region 525, and the emitter, or injector, region 523. As shown in the embodiement of FIG. 5C, the emitter region 523 is coupled to a write data bit line, emitter line, or injector line 529. As shown in the embodiment of FIG. 5C, in some embodiments the base region 525 of the bi-polar transistor 521, which is integrally formed with the substrate 502, is coupled to a ground potential. And, as indicated above, the floating body well 505 of the horizontal MOS transistor and the floating body well 505 to substrate 502 capacitance acts as a storage capacitor 533.

In operation, the sense device used to read the horizontally merged MOS-bipolar transistor gain memory cell 501 is the horizontal MOS transistor 509 which is addressed by the read data word line 517. In the embodiment of a horizontal PMOS transistor 509, if a negative charge or electrons are stored on the floating body 505, then the n-type floating body 505 will be slightly forward biased and the horizontal MOS transistor 509 will be more conductive than normal.

According to the teachings of the present invention, charge is injected on to the floating body 505 of the horizontal MOS transistor 509 by the horizontal, or lateral, bi-polar transistor 521. In the embodiment describe here, the horizontal bi-polar transistor 521 is an npn bi-polar transistor 521. The horizontal bi-polar transistor 521 need not be a high performance device nor have a high current gain. Accordingly, the horizontal bi-polar transistor 521 can be a high yield structure.

During standby the read data word line 517 is driven positive to drive the floating n-type body 505 to a positive potential by capacitive coupling to the read data word line 517. This positive potential serves to keep the floating body 505 reverse biased and avoid charge leakage.

The horizontally merged MOS-bipolar transistor gain memory cell 501 can be erased by driving the drain 511 positive and the gate 513 negative to forward bias the drain-body p-n junction (511–505 junction). (See generally, T. Ohsawa et al., "Memory Design Using One Transistor Gain Cell on SOI," *IEEE Int. Solid State Circuits Conv.*, San Francisco, 152–153 (2002); S. Okhonin, M. Nagoga, J. M. Sallese, P. Fazan, "A SOI Capacitor-less IT-DRAM Cell," *Late News* 2001 *IEEE Intl. SOI Conference*, Durango, Colo., 153–154).

The horizontally merged MOS-bipolar transistor gain memory cell 501 can provide a very high gain and amplification of the stored charge on the floating body 505 of the horizontal, or lateral, PMOS sense transistor 509. A small change in the threshold voltage caused by charge stored on the floating body 505 will result in a large difference in the number of holes conducted between the drain 511 and source of 507 the horizontal PMOS sense transistor 509 during the read data operation.

This amplification allows the small storage capacitance of the sense amplifier floating body 505 to be used instead of a large stacked capacitor storage capacitance. The resulting horizontally merged MOS-bipolar transistor gain memory cell 501 has a very high density with a cell area of approximately 10F$^2$, where F is the minimum feature size, and whose vertical extent is far less than the total height of a stacked capacitor or trench capacitor cell and access transistor. The cell can be fabricated without any modification of conventional CMOS logic technology.

While the description here has been given for a p-type substrate an alternative embodiment would work equally well with n-type or silicon-on-insulator substrates. In that case the sense transistor 509 would be an NMOS transistor with a p-type floating body.

System Level

Figure 6:
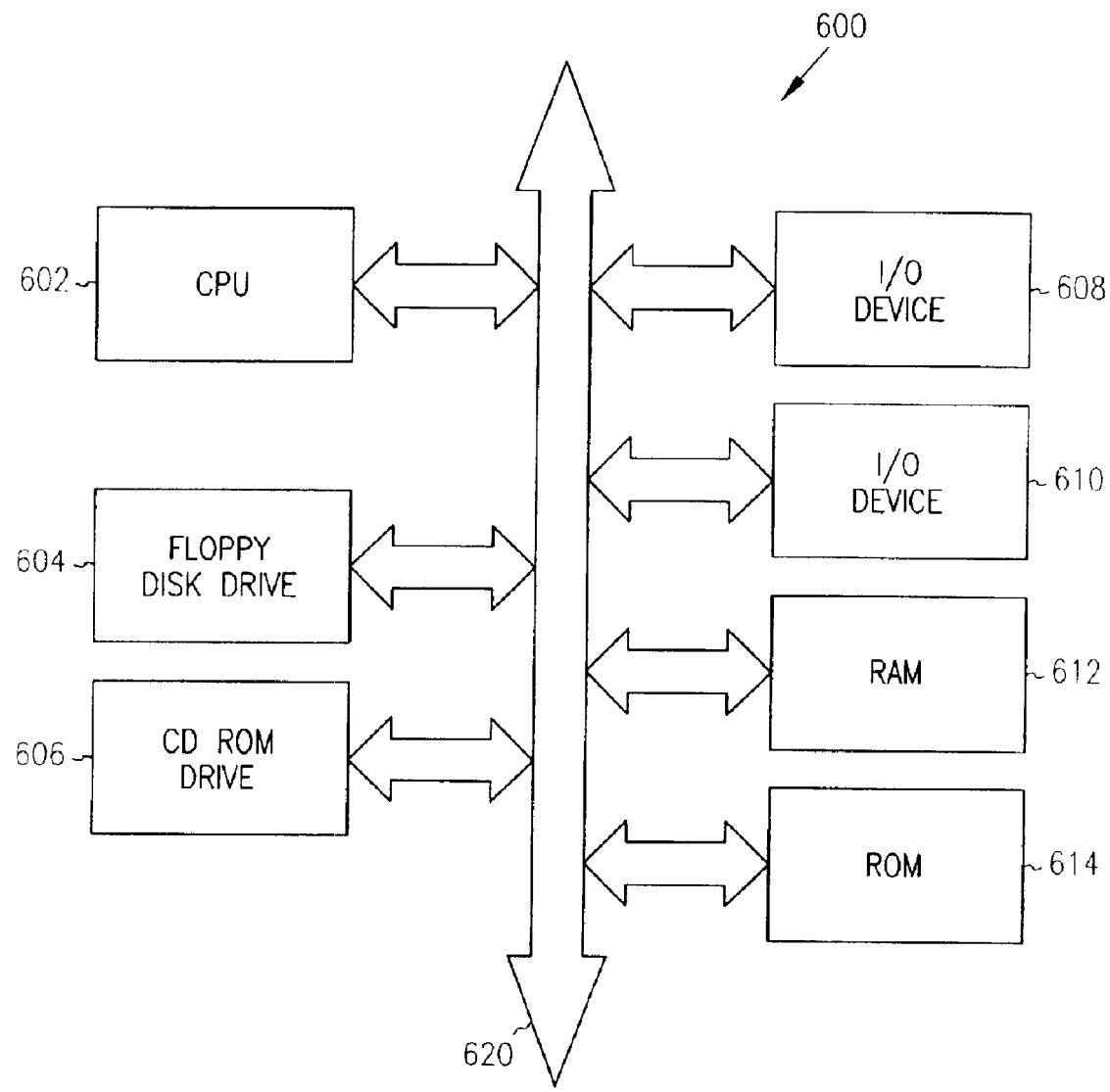
FIG. 6 is a block diagram illustrating an embodiment of an electronic system utilizing the embedded gain memory cells of the present invention.

FIG. 6 is a block diagram of a processor-based system 600 utilizing embedded, horizontally merged MOS-bipolar transistor gain memory cells according to the various embodiments of the present invention. That is, the system 600 utilizes various embodiments of the horizontally merged MOS-bipolar transistor gain memory cell 501 illustrated in FIGS. 5A–5C. The processor-based system 600 may be a computer system, a process control system or any other system employing a processor and associated memory. The system 600 includes a central processing unit (CPU) 602, e.g., a microprocessor, that communicates with the RAM 612 and an I/O device 608 over a bus 620. It must be noted that the bus 620 may be a series of buses and bridges commonly used in a processor-based system, but for convenience purposes only, the bus 620 has been illustrated as a single bus. A second I/O device 610 is illustrated, but is not necessary to practice the invention. The processor-based system 600 can further include read-only memory (ROM) 614 and can include peripheral devices such as a floppy disk drive 604 and a compact disk (CD) ROM drive 606 that also communicates with the CPU 602 over the bus 620 as is well known in the art.

It will be appreciated by those skilled in the art that additional circuitry and control signals can be provided, and that the processor-based system 600 has been simplified to help focus on the invention.

It will be understood that the embodiment shown in FIG. 6 illustrates an embodiment for electronic system circuitry in which the novel embedded, horizontally merged MOS-bipolar transistor gain memory cell 501 of the present invention are used. The illustration of system 600, as shown in FIG. 6, is intended to provide a general understanding of one application for the structure and circuitry of the present invention, and is not intended to serve as a complete description of all the elements and features of an electronic system using the novel horizontally merged MOS-bipolar transistor gain memory cell 501 structures. Further, the invention is equally applicable to any size and type of system 600 using the novel horizontally merged MOS-bipolar transistor gain memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the embedded, horizontally merged MOS-bipolar transistor gain memory cells of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

The embedded, horizontally merged MOS-bipolar transistor gain memory cell of the present invention can provide a very high gain and amplification of a stored charge on the floating body of the horizontal MOS sense transistor. A small change in the threshold voltage caused by charge stored on the floating body will result in a large difference in the number of holes conducted between the drain and source of the horizontal MOS sense transistor during the read data operation. This amplification allows the small storage capacitance of the sense amplifier floating body to be used instead of a large stacked capacitor storage capacitance. The resulting cell has a very high density with a cell area of $10F^2$, where F is the minimum feature size, and whose horizontal extent is far less than the total height of a stacked capacitor or trench capacitor cell and access transistor.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A memory cell, comprising:
a horizontal MOS transistor having a source region, a drain region, and a body region therebetween;
a horizontal bi-polar transistor having an emitter region, a base region and a collector region; and
wherein the collector region for the horizontal bi-polar transistor serves as the body region for the horizontal MOS transistor.

2. The memory cell of claim 1, wherein the horizontal MOS transistor includes a p-channel MOS cell (PMOS) and the horizontal bi-polar transistor includes an N+-P-N horizontal bi-polar transistor.

3. The memory cell of claim 2, wherein the base region for the horizontal bi-polar transistor is coupled to a ground potential.

4. The memory cell of claim 1, wherein the horizontal MOS transistor further includes;
a gate opposing the body region and separated therefrom by a gate oxide; and
a read data word line coupled to the gate.

5. A merged device cell, comprising:
a horizontal MOS transistor having a source region, a drain region, and a floating body region therebetween;
a horizontal bi-polar transistor having an emitter region, a base region and a collector region;
wherein the collector region for the horizontal bi-polar transistor serves as the floating body region for the horizontal MOS transistor; and
a gate opposing the floating body region and separated therefrom by a gate oxide.

6. The merged device cell of claim 5, wherein the horizontal MOS transistor includes a p-channel MOS cell (PMOS) and the horizontal bi-polar transistor includes an N+-P-N horizontal bi-polar transistor.

7. The merged device cell of claim 5, wherein the drain region for the horizontal MOS transistor is coupled to a read data bit line.

8. The merged device cell of claim 5, wherein the emitter region for the horizontal bi-polar transistor is coupled to a write data bit line.

9. The merged device cell of claim 5, wherein the gate is coupled to a read data word line.

10. The merged device cell of claim 5, wherein the horizontal bi-polar transistor is operable to inject a charge on to the floating body of the horizontal MOS transistor.

11. The merged device cell of claim 10, wherein the floating body is operable to store charge by capacitive coupling to the gate and produces a change in the threshold voltage of the horizontal MOS transistor.

12. The merged device cell of claim 5, wherein the merged device cell has an area equal to or less than 10 square photolithographic features (10F2).

13. An embedded, merged MOS-bipolar gain memory cell, comprising:
a horizontal MOS transistor having a source region, a drain region, and a floating body region therebetween;
a horizontal bi-polar transistor having an emitter region, a base region and a collector region;
wherein the collector region for the horizontal hi-polar transistor serves as the body region for the horizontal MOS transistor
a gate opposing the floating body region and separated therefrom by a gate oxide; and
wherein the horizontal bi-polar transistor is used to modulate the threshold voltage and conductivity of the horizontal MOS transistor.

14. The cell of claim 13, wherein the horizontal MOS transistor is a p-channel MOS transistor (PMOS).

15. The cell of claim 13, wherein the horizontal bi-polar transistor includes an N+-P-N horizontal bi-polar transistor.

16. The cell of claim 13, wherein the cell is a dynamic random access memory (DRAM) cell.

17. A memory array, comprising:
a number of merged device cells formed on a substrate, wherein each merged device cell includes;
a horizontal MOS transistor having a source region, a drain region, and a floating body region therebetween;
a horizontal hi-polar transistor having an emitter region, a base region and a collector region;
wherein the collector region for the horizontal bi-polar transistor serves as the floating body region for the horizontal MOS transistor; and
a gate opposing the floating body region and separated therefrom by a gate oxide; and
a read data word line coupled to the gate of each merged device cell along rows of the array.

18. The memory array of claim 17, wherein the horizontal MOS transistor includes a p-channel MOS cell (PMOS) and the horizontal bi-polar transistor includes an N+-P-N horizontal bi-polar transistor.

19. The memory array of claim 17, wherein the array further includes a write data bit line coupled to the emitter region of each merged device cell along columns of the array.

20. The memory array of claim 17, wherein the array further includes a read data bit line coupled to the source region of each merged device cell along columns of the array.

21. The memory array of claim 17, wherein the base region of each merged device cell in the array is coupled to a ground potential.

22. The memory array of claim 17, wherein the horizontal bi-polar transistor is operable to modulate the threshold voltage and conductivity of the horizontal MOS transistor in each merged device cell.

23. The memory array of claim 17, wherein the memory array is included in a dynamic random access memory (DRAM) chip.

24. An electronic system, comprising:
a processor; and
an embedded memory operably coupled to the processor, wherein the memory includes a memory array having;
a number of merged device cells formed on a substrate, wherein each merged device cell includes:
a horizontal MOS transistor having a source region, a drain region, and a floating body region therebetween;
a horizontal bi-polar transistor having an emitter region, a base region and a collector region;
wherein the collector region for the horizontal bi-polar transistor serves as the floating body region for the horizontal MOS transistor; and
a gate opposing the floating body region and separated therefrom by a gate oxide; and
a read data word line coupled to the gate of each merged device cell along rows of the array.

25. The system of claim 24, wherein the horizontal MOS transistor includes a p-channel MOS cell (PMOS) and the horizontal bi-polar transistor includes an N+-P-N horizontal bi-polar transistor.

26. The system of claim 24, wherein the array further includes an injector line coupled to the emitter region of each merged device cell along columnss of the array.

27. The system of claim 24, wherein the array further includes a read data bit line coupled to the source region of each merged device cell along columns of the array.

28. The system of claim 24, wherein the array is fabricated using planar CMOS processing techniques.

29. The system of claim 24, wherein the horizontal bi-polar transistor is operable to inject a charge on to the floating body of the horizontal MOS transistor in each merged device cell.

30. The system of claim 29, wherein the floating body of the horizontal MOS transistor includes an n-type conductivity well formed in a p-type conductivity substrate.

31. The system of claim 24, wherein the processor and memory are formed on a single chip.

32. A method of forming a memory cell, comprising:
forming a horizontal MOS transistor having a source region, a drain region, and a floating body region therebetween;
forming a horizontal bi-polar transistor having an emitter region, a base region and a collector region;
wherein the forming the floating body region for the horizontal MOS transistor includes forming the floating body region to serve as the collector region for the horizontal bi-polar transistor; and
forming a gate opposing the floating body region and separated therefrom by a gate oxide.

33. The method of claim 32, wherein forming the horizontal MOS transistor includes forming a p-channel MOS (PMOS) transistor, and forming the horizontal bi-polar transistor includes forming an N+-P-N horizontal bi-polar transistor.

34. The method of claim 32, wherein the method includes forming a write data bit line coupled to the emitter region of the horizontal bi-polar transistor.

35. The method of claim 32, wherein the method includes forming a read data bit line coupled to the source region of the horizontal MOS transistor.

36. The method of claim 32, wherein method includes forming a read data word line coupled to the gate of the horizontal MOS transistor.

37. The method of claim 32, wherein forming the memory cell includes forming a the horizontal MOS transistor and the horizontal bi-polar transistor using planar CMOS processing techniques.

38. The method of claim 32, wherein forming the horizontal hi-polar transistor includes forming a horizontal bi-polar transistor with is operable to inject a charge on to the floating body region of the horizontal MOS transistor.

39. The method of claim 32, wherein forming the memory cell includes forming a dynamic random access memory (DRAM) cell.

40. The method of claim 32, wherein the method further includes forming the memory cell in a memory array on a wafer.

41. A method for operating a memory cell, comprising:
providing a merged device cell, the merged device cell including;
a horizontal MOS transistor having a source region, a drain region, and a floating body therebetween;
a horizontal bi-polar transistor having an emitter region, a base region and a collector region; and
wherein the collector region for the horizontal hi-polar transistor serves as the floating body for the horizontal MOS transistor; and
modulating a threshold voltage and a conductivity of the horizontal MOS transistor using the horizontal bi-polar transistor.

42. The method of claim 41, wherein the method includes storing a first state on the floating body, wherein storing a first state on the floating body includes forward biasing the floating body.

43. The method of claim 41, wherein the method includes reading the cell using the horizontal MOS transistor.

44. The method of claim 41, wherein the method includes storing a charge on the floating body.

45. The method of claim 41, wherein providing a merged device cell includes providing a horizontal p-channel MOS transistor (PMOS) and providing a horizontal N+-P-N bi-polar transistor.

46. The method of claim 41, wherein the method further includes providing a standby state, wherein the standby state includes;
   applying a positive potential to a gate of the horizontal MOS transistor; and
   driving the floating body to a positive potential by capacitive coupling with the gate to keep the floating body reverse biased.

47. The method of claim 41, wherein method includes storing a second state on the floating body, wherein storing a second state on the floating body includes;
   applying a positive potential to the drain region; and
   applying a negative potential to a gate of the horizontal MOS transistor to forward bias a drain-floating body p-n junction.

48. An embedded memory cell, comprising:
   a horizontal MOS transistor having a source region, a drain region, and a floating body region therebetween;
   a gate opposing the floating body region and separated therefrom by a gate oxide on a first side of the horizontal MOS transistor; and
   bi-polar transistor means for injecting a charge on the floating body region of the horizontal MOS transistor in order to modulate a threshold voltage and conductivity of the horizontal MOS transistor.

49. The memory cell of claim 48 wherein injecting the charge on to the floating region of the horizontal MOS transistor in order to modulate the threshold voltage and the conductivity includes forward biasing the floating body region of the horizontal MOS transistor using a horizontal bi-polar transistor.

50. The memory cell of claim 49, wherein the horizontal MOS transistor is a p-channel MOS (PMOS) transistor and the horizontal bi-polar transistor includes a horizontal N+-P-N bi-polar transistor, and wherein the floating body region of the horizontal MOS transistor includes an n-type conductivity well formed in a p-type conductivity substrate.

* * * * *

UNITED STATES PATENT AND TRADEMARK OFFICE
CERTIFICATE OF CORRECTION

PATENT NO. : 7,030,436 B2
APPLICATION NO. : 10/309873
DATED : April 18, 2003
INVENTOR(S) : Forbes It is certified that error appears in the above-identified patent and that said Letters Patent is hereby corrected as shown below:

On page 2, in field (56), under "Other Publications", in column 1, line 3, delete "VLSi" and insert -- VLSI --, therefor.

On page 2, in field (56), under "Other Publications", in column 1, line 10, delete "Build-in" and insert -- Built-in --, therefor.

On page 2, in field (56), under "Other Publications", in column 1, line 13, delete "(Netherlands).," and insert -- (Netherlands), --, therefor.

On page 2, in field (56), under "Other Publications", in column 1, line 14, delete "vol." and insert -- Vol. --, therefor.

On page 2, in field (56), under "Other Publications", in column 1, line 20, delete "Typed" and insert -- Type --, therefor.

On page 2, in field (56), under "Other Publications", in column 2, line 44, delete ""Novel" and insert -- "A Novel --, therefor.

On page 2, in field (56), under "Other Publications", in column 2, line 48, delete "logic" and insert -- Logic --, therefor.

On page 2, in field (56), under "Other Publications", in column 2, line 57, delete "Integrated" and insert -- integrated --, therefor.

On page 3, in field (56), under "Other Publications", in column 1, line 11, delete "Self-amplifying" and insert -- self-amplifying --, therefor.

On page 3, in field (56), under "Other Publications", in column 2, line 4, delete "vol." and insert -- Vol. --, therefor.

In column 2, line 47, delete "generallly," and insert -- generally, --, therefor.

In column 6, line 35, after "portion" delete "of the".

In column 7, line 47, delete "embodiement" and insert -- embodiment --, therefor.

In column 8, line 19, delete "IT-DRAM" and insert -- 1T-DRAM --, therefor.

In column 10, line 48, in Claim 12, delete "(10F2)." and insert -- $(10F^2)$. --, therefor.

UNITED STATES PATENT AND TRADEMARK OFFICE
CERTIFICATE OF CORRECTION

PATENT NO.       : 7,030,436
APPLICATION NO.  : 10/309873
DATED            : April 18, 2006
INVENTOR(S)      : Forbes It is certified that error appears in the above-identified patent and that said Letters Patent is hereby corrected as shown below:

In column 10, line 56, in Claim 13, delete "hi-polar" and insert -- bi-polar --, therefor.

In column 11, line 9, in Claim 17, delete "hi-polar" and insert -- bi-polar --, therefor.

In column 11, line 64, in Claim 26, delete "columnss" and insert -- columns --, therefor.

In column 12, line 38, in Claim 37, after "forming" delete "a".

In column 12, line 42, in Claim 38, delete "hi-polar" and insert -- bi-polar --, therefor.

In column 12, line 43, in Claim 38, delete "with" and insert -- which --, therefor.

In column 12, line 58, in Claim 41, delete "hi-polar" and insert -- bi-polar --, therefor.

Signed and Sealed this

Eighth Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 7,030,436 B2
APPLICATION NO. : 10/309873
DATED : April 18, 2006
INVENTOR(S) : Forbes It is certified that error appears in the above-identified patent and that said Letters Patent is hereby corrected as shown below:

On page 2, in field (56), under "Other Publications", in column 1, line 3, delete "VLSi" and insert -- VLSI --, therefor.

On page 2, in field (56), under "Other Publications", in column 1, line 10, delete "Build-in" and insert -- Built-in --, therefor.

On page 2, in field (56), under "Other Publications", in column 1, line 13, delete "(Netherlands).," and insert -- (Netherlands), --, therefor.

On page 2, in field (56), under "Other Publications", in column 1, line 14, delete "vol." and insert -- Vol. --, therefor.

On page 2, in field (56), under "Other Publications", in column 1, line 20, delete "Typed" and insert -- Type --, therefor.

On page 2, in field (56), under "Other Publications", in column 2, line 44, delete ""Novel" and insert -- "A Novel --, therefor.

On page 2, in field (56), under "Other Publications", in column 2, line 48, delete "logic" and insert -- Logic --, therefor.

On page 2, in field (56), under "Other Publications", in column 2, line 57, delete "Integrated" and insert -- integrated --, therefor.

On page 3, in field (56), under "Other Publications", in column 1, line 11, delete "Self-amplifying" and insert -- self-amplifying --, therefor.

On page 3, in field (56), under "Other Publications", in column 2, line 4, delete "vol." and insert -- Vol. --, therefor.

In column 2, line 47, delete "generallly," and insert -- generally, --, therefor.

In column 6, line 35, after "portion" delete "of the".

In column 7, line 47, delete "embodiement" and insert -- embodiment --, therefor.

In column 8, line 19, delete "IT-DRAM" and insert -- 1T-DRAM --, therefor.

In column 10, line 48, in Claim 12, delete "(10F2)." and insert -- (10F$^2$). --, therefor.

UNITED STATES PATENT AND TRADEMARK OFFICE
CERTIFICATE OF CORRECTION

PATENT NO.         : 7,030,436 B2
APPLICATION NO. : 10/309873
DATED               : April 18, 2006
INVENTOR(S)      : Forbes It is certified that error appears in the above-identified patent and that said Letters Patent is hereby corrected as shown below:

In column 10, line 56, in Claim 13, delete "hi-polar" and insert -- bi-polar --, therefor.

In column 11, line 9, in Claim 17, delete "hi-polar" and insert -- bi-polar --, therefor.

In column 11, line 64, in Claim 26, delete "columnss" and insert -- columns --, therefor.

In column 12, line 38, in Claim 37, after "forming" delete "a".

In column 12, line 42, in Claim 38, delete "hi-polar" and insert -- bi-polar --, therefor.

In column 12, line 43, in Claim 38, delete "with" and insert -- which --, therefor.

In column 12, line 58, in Claim 41, delete "hi-polar" and insert -- bi-polar --, therefor.

This certificate supersedes Certificate of Correction issued August 8, 2006.

Signed and Sealed this

Tenth Day of October, 2006

JON W. DUDAS
*Director of the United States Patent and Trademark Office*